(12) United States Patent
Huang et al.

(10) Patent No.: US 8,823,098 B2
(45) Date of Patent: Sep. 2, 2014

(54) STRUCTURES FOR POWER TRANSISTOR AND METHODS OF MANUFACTURE

(75) Inventors: Qin Huang, Wuxi (CN); Yuming Bai, Wuxi (CN)

(73) Assignee: Wuxi Versine Semiconductor Corp. Ltd., Wuxi, Jiangsu, Province (CN)

( * ) Notice: Subject to any disclaimer, the term of this patent is extended or adjusted under 35 U.S.C. 154(b) by 163 days.

(21) Appl. No.: 13/414,292

(22) Filed: Mar. 7, 2012

(65) Prior Publication Data

US 2012/0248534 A1 Oct. 4, 2012

(30) Foreign Application Priority Data

Mar. 31, 2011 (CN) .......................... 2011 1 0081027

(51) Int. Cl.
| | |
|---|---|
| *H01L 29/66* | (2006.01) |
| *H01L 27/088* | (2006.01) |
| *H01L 29/788* | (2006.01) |
| *H01L 29/78* | (2006.01) |
| *H01L 29/423* | (2006.01) |
| *H01L 29/739* | (2006.01) |
| *H01L 29/10* | (2006.01) |
| *H01L 29/08* | (2006.01) |
| *H01L 29/417* | (2006.01) |

(52) U.S. Cl.
CPC ......... *H01L 29/7802* (2013.01); *H01L 29/1095* (2013.01); *H01L 29/0878* (2013.01); *H01L 29/41766* (2013.01); *H01L 29/42376* (2013.01); *H01L 29/66727* (2013.01); *H01L 29/7396* (2013.01); *H01L 29/0834* (2013.01)
USPC ........... 257/341; 257/396; 257/315; 257/321; 257/322; 257/324; 438/186; 438/201; 438/218; 438/527; 438/266

(58) Field of Classification Search
CPC ............ H01L 29/7802; H01L 29/1095; H01L 29/66712; H01L 29/66734; H01L 29/42372; H01L 29/42376
USPC ......... 257/296, 315, 321, 322, 324, 330, 331, 257/334, 341; 438/186, 201, 218, 527, 266
See application file for complete search history.

(56) References Cited

U.S. PATENT DOCUMENTS

2005/0136587 A1* 6/2005 Venkatraman et al. ....... 438/218
2007/0278571 A1* 12/2007 Bhalla et al. .................. 257/341

* cited by examiner

*Primary Examiner* — Julio J Maldonado
*Assistant Examiner* — Cory Eskridge
(74) *Attorney, Agent, or Firm* — Jacobson Holman PLLC; Jiwen Chen

(57) ABSTRACT

The invention discloses a manufacture method and structure of a power transistor, comprising a lower electrode, a substrate, a drift region, two first conductive regions, two second conductive regions, two gate units, an isolation structure and an upper electrode. The two second conductive region are between the two first conductive regions and the drift region; the two gate units are on the two second conductive regions; the isolation structure covers the two gate units; the upper electrode covers the isolation structure and connects to the two first conductive regions and the two second conductive regions electrically. When the substrate is of the first conductive type, the structure can be used as MOSFET. When the substrate is of the second conductive type, the structure can be used as IGBT. This structure has a small gate electrode area, which leads to less Qg, Qgd and Rdson and improves device performance.

15 Claims, 5 Drawing Sheets

STRUCTURES FOR POWER TRANSISTOR AND METHODS OF MANUFACTURE

The present application claims the priority of Chinese Application No. 201110081027.4 filed Mar. 31, 2001, under 35 U.S.C. §119, which hereby incorporated by reference.

TECHNICAL FIELD

This invention relates to a structure for a type of power transistor and its methods of manufacture, more particularly, to MOSFET (Metal-Oxide-Semiconductor Field-Effect Transistor) and IGBT (Insulated Gate Bipolar Transistor) and its methods of manufacture. It belongs to the field of semiconductor device and manufacture thereof.

BACKGROUND OF THE INVENTION

VDMOS and IGBT are two commonly used power transistors. IGBT is comprised of BJT and MOS, which has the advantage of MOSFET's high impedance and BJT's low conduction voltage. It is very suitable for the fields of AC motor, frequency converter, switching power supply, lighting circuit, traction and driving. VDMOS is a voltage controlled device. Under the proper control of the gate voltage, the surface of the semiconductor is inversed and forms a conduction path. Thus, an appropriate amount of current flows vertically between drain and source electrodes. VDMOS has the advantages of both BJT and MOS. Compared to BJT, it switches faster and has less switching loss. Its input impedance is high and driving power is small. It has good frequency characteristics and high linear transconductance. It should be pointed out particularly that it has a negative temperature coefficient and does not have the second-breakdown problem of BJT. It has a larger safe operating area. Therefore, for both switching and linear applications, VDMOS is an ideal power device. At present, VDMOS is widely used in various fields, including motor frequency adjustment, inverter, UPS, switching power supply, electrical switch, automotive electrical and electronic ballast.

Usually, VDMOS uses a traditional integrated gate region. The channel is only formed at two sides of the gate region. In this structure, there is a large overlap between the silicon gate and the drain electrode. It has significant Qgd. In addition, the manufacture of this traditional structure is rather complex. Six (6) or seven (7) steps of masking are needed for the whole process. Therefore, the production cost is relatively higher.

In order to improve the device performance, simplify the production process and reduce the cost, the present invention provides a new structure of planar power transistor.

CONTENT OF THE INVENTION

The invention solves the technical problems by providing structures and manufacture methods of a power transistor.

In order to solve the technical problems described above, the invention uses the following technical schemes:

A type of power transistor structure, which comprises:
a drain electrode;
a first conductive substrate, which is located on the drain electrode;
a first conductive drift region, which is on said first conductive substrate;
two first conductive source regions, which are located on the two sides of said the first conductive drift region, respectively;
two second conductive region, which are located between two of the first conductive source regions and the first conductive drift region;
two gate units, which are located on two of the second conductive region;
an isolation structure, which covers the surface of said two gate units, isolates two gate units;
there is no direct connection between the two gates;
a source electrode, which covers the surface of the isolation structure, conducts with two of the first conductive source regions and two of the second conductive regions.

Said gate unit comprises a gate isolation layer and a gate layer on it. Preferably, there is an isolation layer on the gate electrode layer.

As preferred scheme of the invention, there is a first conductive region in the first conductive drift region, which is located between two of the second conductive regions.

Another type of a power transistor structure comprises:
a collector electrode;
a second conductive substrate, which is on said collector electrode;
a first conductive drift region, which is on said the second conductive substrate;
two first conductive emitters regions, which are located on the two sides of the first conductive drift region, respectively;
two second conductive regions, which are located between two of the first conductive emitters regions and the first conductive drift region, respectively;
two gate units, which are on the two second conductive regions, respectively;
an isolation structure, which covers the surface of said two gate units and isolates the two gate units;
an emitter, which covers the surface of the said isolation structure, conducts with two of the first conductive source regions and two of the second conductive regions.

Said gate unit comprises a gate isolation layer and a gate layer on it. Preferably, there is an isolation layer on the gate electrode layer.

As a preferred scheme of the present invention, there is a first conductive region in the first conductive drift region, which is located between two of the second conductive regions.

A manufacture method of said power transistor includes the steps as follows:

Step 1. The lightly doped first conductive epitaxial layer forms on the semiconductor substrate, on which two gate units are made. The thickness of the epitaxial layer is variable.

Step 2. An isolation structure is made around said two gate units. This structure covers the surface of said two gate units and isolates the two gate units.

Step 3. Two heavily doped first conductive regions and two second conductive regions are formed on the two sides of said isolation structure in the epitaxial layer, the rest of which is the drift region. On each side of said isolation structure, there is one heavily doped first conductive region and one second conductive region. Each side of the heavily doped first conductive region extends below said isolation structure. Moreover, each side of the second conductive region extends below the gate unit adjacent to it and separates the heavily doped first conductive region and the drift region.

Step 4. Etching off the first conductive region, which is not blocked by said isolation structure.

Step 5. Making electrodes, which are connected to the first and the second conductive regions which are on the sides of said isolation structure.

Step 6. Making electrode under said semiconductor substrate. When making the FET, in step 1, the semiconductor substrate uses the first conductive substrate; when making the IGBT, in step 1, the semiconductor substrate uses the second conductive substrate.

Said gate unit comprises a gate dielectric layer and a gate electrode layer on top of it. Preferably, there is an isolation layer on the gate electrode layer.

Preferably, in step 1, the first conductive region can use an ion implantation method to enhance the ion concentration of the first conductive region on the top of the epitaxial layer. Thus, extra first conductive ion implantation region in the drift region improves the ion concentration in the drift region and reduce impedance.

Preferably, in step 3, by the ion implantation method, two heavily doped first conductive regions and two second conductive regions are formed on the two sides of said isolation structure in the epitaxial layer.

Preferably, in step 3, by a thermal diffusion method, the heavily doped first and second conductive regions are enlarged. Each side of the heavily doped first conductive region extends below said isolation structure. Moreover, each side of the second conductive region extends below the gate unit adjacent to it and separates the heavily doped first conductive region and the drift region.

The beneficial effects of the invention are as follows. The power transistor described by the invention uses a new structure with an isolation structure surrounding two gate units. Compared to the traditional gate structure, the new structure has less gate area. Therefore, the gate charge Qg can be reduced by reducing the gate area. Moreover, the overlap area between the gate and the drain is less and Qgd is reduced effectively. By extra ion implantation onto the drift region, the on-state resistance Rdson can be reduced effectively and improves the FOM further. The manufacture process is simpler. It only needs photo mask when making the gate, etching source region and making source electrode. Because the whole process takes only three (3) masks, the cost is reduced significantly.

DETAILED DESCRIPTION OF THE INVENTION

The device structure provided by the present invention is explained further with drawings as follows. Drawings are merely illustrative and may not be drawn to scale.

The First Embodiment

Figure 1:
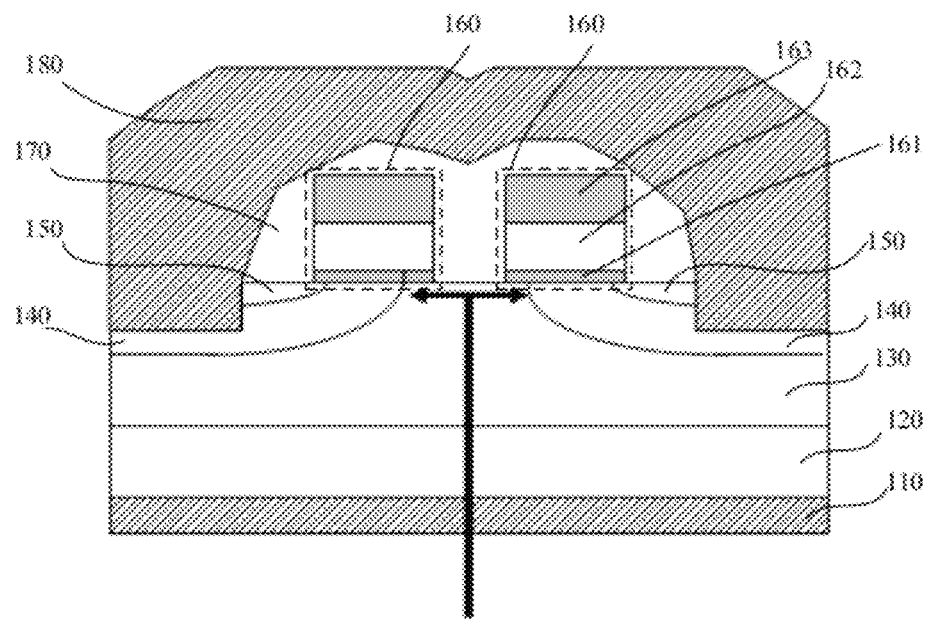
FIG. 1 is the schematic of the power MOSFET structure described in the first embodiment.

A MOSFET structure is provided by this embodiment. As shown in FIG. 1, the device structure comprises: a drain electrode 110; a first conductive substrate 120 on the drain electrode 110; a drift region 130 on the first conductive substrate 120; two first conductive source regions 150 located on the two sides of the drift region 130, respectively; two conductive region 140 located between two second conductive regions 140 and the drift region 130; two gate units 160 on the two second conductive region 140, respectively; an isolation structure 170 covers the surface of two gate units 160 and isolates the two gate units 160 electrically; the source electrode 180 covers the surface of the isolation structure 170. The source electrode 180 is connected to two of the first conductive source regions 150 and two of the second conductive body regions 140 electrically.

In the case of NMOS, the first conductive substrate uses N+ type semiconductor substrate. The drift region 130 can be of N-type. The second conductive region 140 is of P-type. The first conductive source region 150 is of N+ source. Gate unit 160 comprises a gate dielectric layer 161 and a gate dielectric layer 162 on top of the gate dielectric layer 161. Preferably, there is an isolation layer 163 on top of the gate electrode layer 162. Usually, the material of the gate dielectric layer can be silicon dioxide, nitrogen oxygen silicon compounds or hafnium based high dielectric constant materials. The gate electrode layer can be the traditional poly silicon or one or a combination of the following materials: nickel, titanium, tantalum, tungsten, tantalum nitride, tungsten nitride, titanium nitride, titanium silicide, tungsten silicide or nickel silicide.

When MOS device works, the current direction is shown as the arrow in FIG. 1. By controlling the two gate unit 160, the surface of the two second conductive region can be inversed and forms two conduction channels. Then, current flows vertically between the drain and source electrodes. Such device structure uses two gate units 160 to replace the one gate region in the traditional VDMOS. An isolation structure exits between the two gate structures 160. Compared to the same sized VDMOS, the gate region between the two gate units is removed. Hence, the effective gate area is less and Qg is less too. Moreover, the overlap area of gate and drain is less than that of the traditional one gate structure. Therefore, Qgd is reduces effectively.

Figure 2:
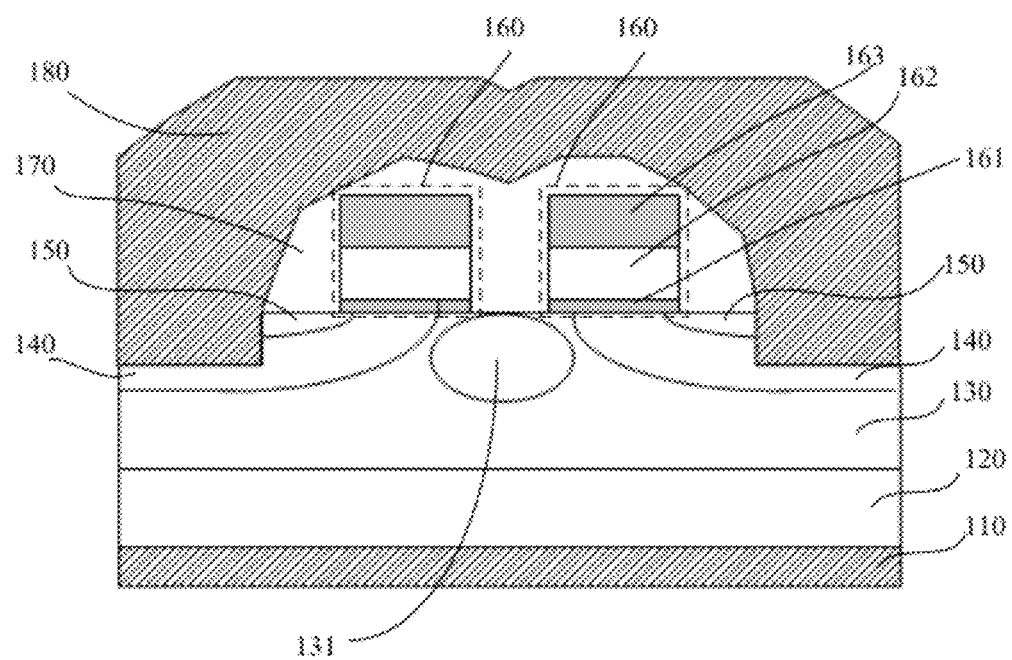
FIG. 2 is the schematic of the power MOSFET structure described in the first embodiment.

FIG. 2 shows a structural schematic of said enhanced device. By the extra implantation of the first conductive (N) ion into the drift region, the first conductive ion implantation region 131 formed in the drift region to increase the ion concentration in the drift region. Hence, the drain to source on-state resistance Rdson is reduced effectively.

Because FOM is related to Qg, Qgd and Rdson as follows, $$FOM1 = Rdson * Qg$$

$$FOM2 = Rdson * Qgd$$

the device structure provided by the embodiment can reduce Qg, Qgd and Rdson to improve the device performance and FOM.

Figure 3A:
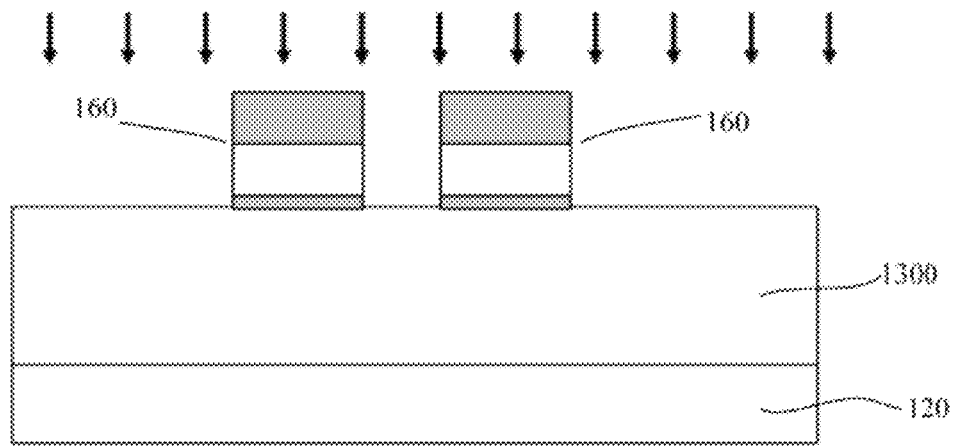
FIGS. 3a-3f show the process flow of the power MOSFET structure described in the first embodiment.

Referring to FIGS. 3a-3f, the manufacture method of said power transistor comprises the following steps:

Step 1. As shown in FIG. 3a, the first conductive epitaxial layer 1300 (N-type epitaxial layer) is formed on the semiconductor substrate, on which two gate units 160 are made. The thickness of the epitaxial layer 1300 is variable.

In addition, by the implantation of the first conductive (N) ion, the first conductive ion concentration on the top of epitaxial layer could be enhanced. An extra ion implantation region 131 (N-type region) forms in the drift region to enhance the ion concentration in the drift region to reduce the impedance.

Figure 3B:
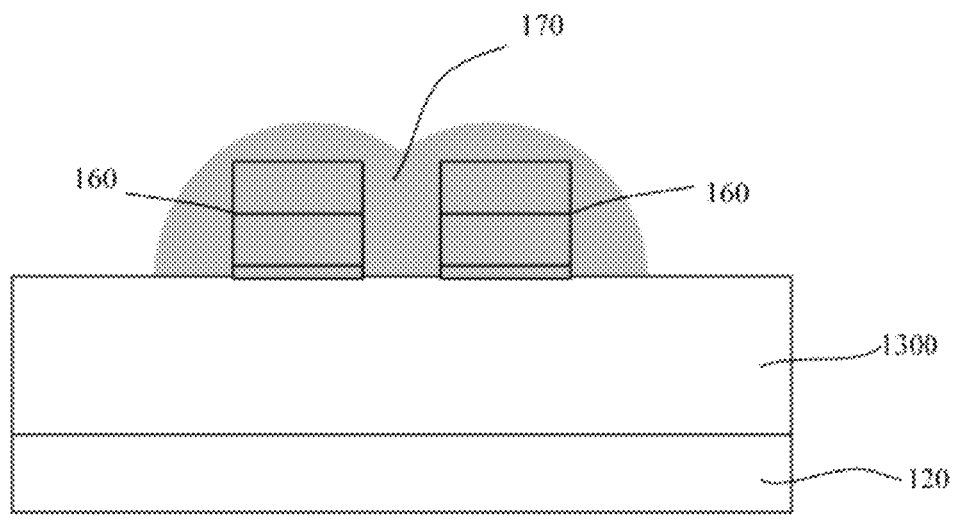

Step 2. As shown in FIG. 3b, an isolation structure 170 is made around said two gate units 160. This structure covers the surface of said two gate units 160 and isolates the two gate units 160. There is no direct connection between the two gate units 160.

Figure 3C:
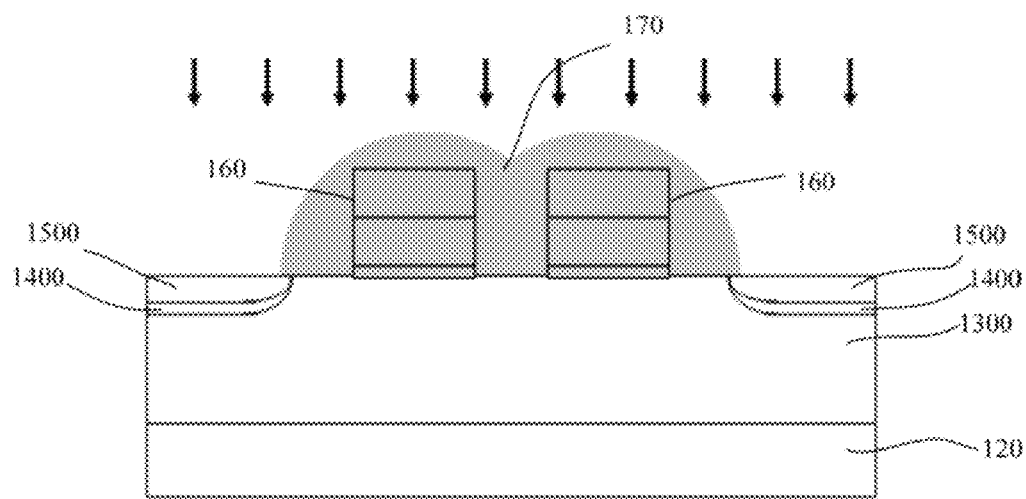

Step 3. As shown in FIG. 3c, by the implantation of P and N ion, two heavily doped first conductive regions 1500 (N+type) and two second conductive regions 1400 (P-type) are formed on the two sides of the isolation structure 170 in the epitaxial layer 1300, the rest of which is a drift region 130. Each side of the second conductive region 1400 extends below the heavily doped first conductive region 1500.

Figure 3D:
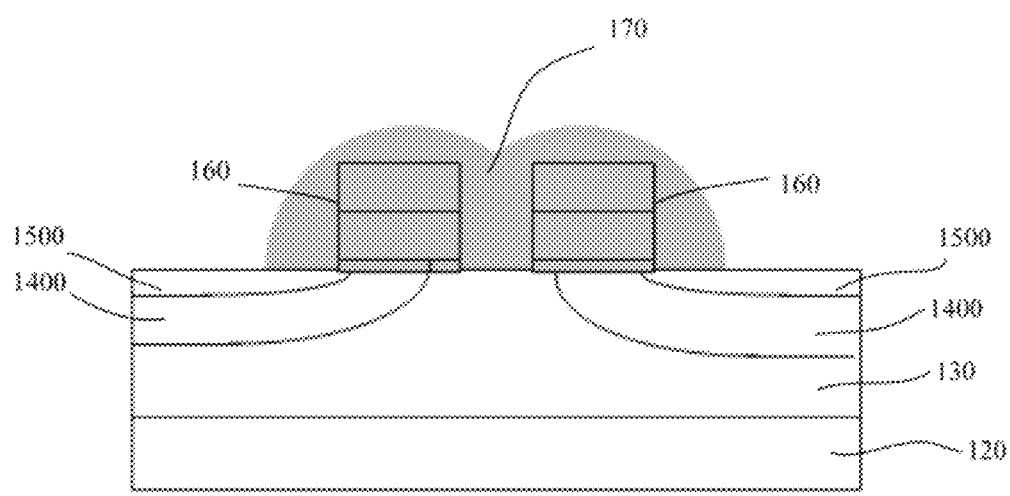

Then, by thermal annealing, the heavily doped first conductive region 1500 and the second conductive region 1400 can be expanded. Each heavily doped first conductive region 1500 extends below the isolation structure 170. In addition, the second conductive region 1400 extends below the gate unit 160. The second conductive region 1400 separates the first conductive region 1500 from the drift region 130 as shown in FIG. 3d.

Figure 3E:
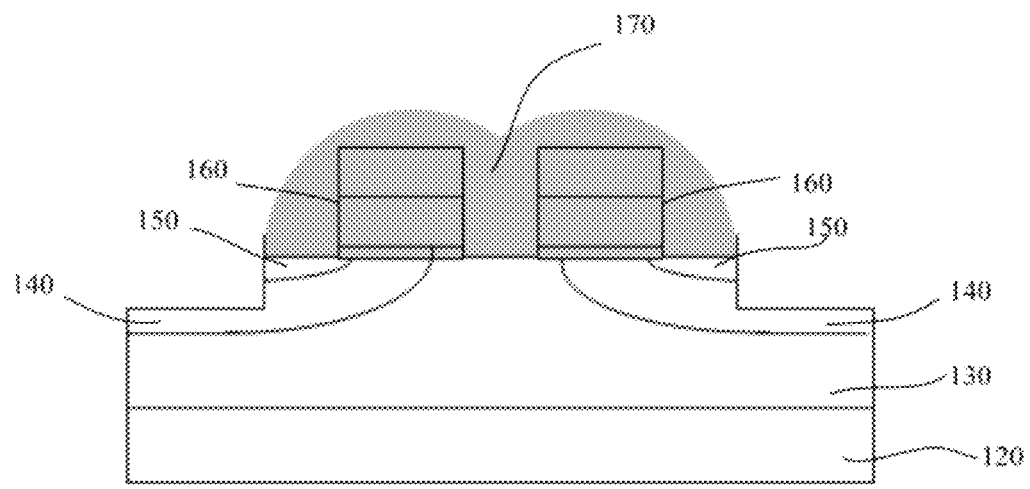

Step 4. As shown in FIG. 3e, the first conductive region 1500 is etched off, which is not blocked by said isolation structure to form the source of the first conductive region 150 and to expose the second conductive region 140.

Figure 3F:
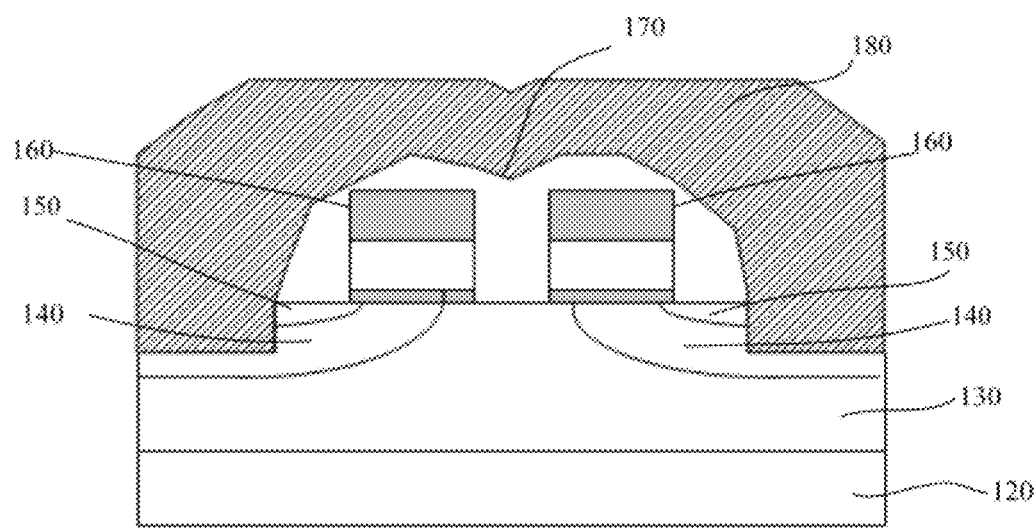

Step 5. As shown in FIG. 3f, the first electrodes are made, which is the source electrode 180. The source electrode 180 is connected to the first conductive source region 150 and the second conductive region 140 which are isolated by the isolation structure 170.

Step 6. The second electrode is made, which is a drain electrode, under the first conductive substrate. There is no drawing for this step. Please refer to FIG. 1. Thus, the manufacture process is relatively simple. It only needs photo mask when making the gate, etching source region and making source electrode. Because the whole process takes only three (3) masks, the cost is reduced significantly.

The Second Embodiment

Figure 4:
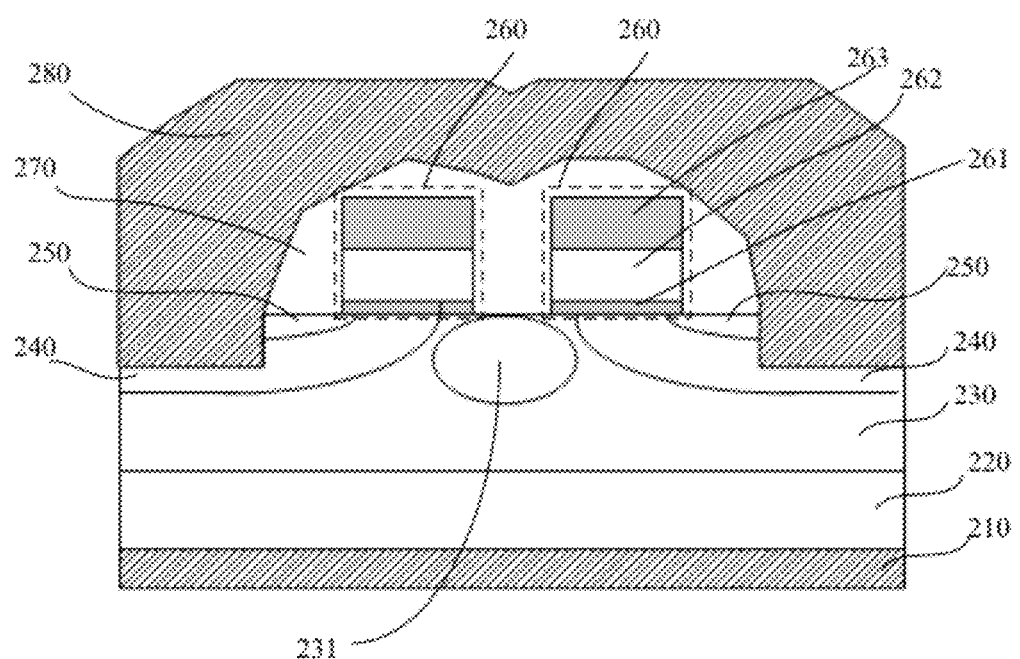
FIG. 4 is the schematic of power IGBT described in the second embodiment.

This embodiment provides a device structure of IGBT, as shown in FIG. 4, which comprises:

A collector 210, a second conductive substrate region 220 on the collector 210, a drift region 230 on the second conductive substrate 220, two first conductive type emitters on each side of the drift region 230 of the first conductive type, two of the second conductive region 240 located between two of the second conductive emitter 250 and two first conductive drift region 230, two gate units 260 located on two of the second conductive region 240, an isolation structure 270 covering the surface of two gate units 260 and separating two gate units 260 electrically, an emitter 280 covering the surface of the isolation structure 270. The emitter 280 is connected to two of the first conductive emitter 250 and two of the second conductive region 240.

Wherein, the gate unit 260 comprises a gate dielectric layer 261 and a gate electrode layer 262 on the top of the gate dielectric layer 261. Preferably, an isolation layer 263 is set on the gate electrode layer 262.

Preferably, in the drift region 230, there is a first conductive ion implantation region 231, which is located between two of the second conductive region 240 to enhance the ion concentration in this region and reduce the on-state resistance effectively.

The method of manufacture of the second embodiment is similar to the first embodiment. The difference is, in step 1, when making MOS, the semiconductor substrate uses the first conductive substrate; when making IGBT, the semiconductor substrate uses the second conductive substrate.

Other technologies related to the invention are in a well-known to those skilled in the art. Thus, they are not repeated here. It should also be appreciated that the exemplary embodiment or exemplary embodiments are only examples, and are not intended to limit the invention in any way. It should be understood that any technical scheme without departing from the scope of the invention is covered by the present patent application.

The invention claimed is:

1. A power transistor structure consisting of:
   a drain electrode;
   a first conductive substrate on the drain electrode;
   a first conductive drift region on the first conductive substrate;
   two first conductive source regions on each side of the first conductive drift region, respectively;
   two second conductive body regions, each of which is between the two first conductive source regions and the first conductive drift region, respectively;
   two gate units, each of which is on the second conductive body region;
   a single isolation structure covering a surface of said gate units and isolating two gate units electrically;
   a single source electrode covering a surface of said isolation structure and separately connecting the two first conductive regions and the two second conductive regions electrically.

2. The power transistor of claim 1 characterized in that: said gate unit including a gate dielectric layer and a gate electrode layer on the gate dielectric layer.

3. The power transistor of claim 2 characterized in that: an isolation layer being on said gate electrode layer.

4. The power transistor of claim 1 characterized in that: in the first conductive drift region, there is a first conductive ion implantation region, the implantation region is between the two second conductive body regions.

5. A power transistor structure consisting of:
   a collector electrode;
   a second conductive substrate on the collector electrode;
   a first conductive drift region on the second conductive substrate;
   two first conductive emitter regions on each side of the first conductive drift region, respectively;
   two of second conductive body region, each of which is between the two first conductive source regions and the first conductive drift region;
   two gate units, each of which is on the second conductive body region;
   a single isolation structure covering a surface of said gate units and isolating two gate units electrically;
   a single emitter electrode covering a surface of said isolation structure and separately connecting the two first conductive regions and the two second conductive regions electrically.

6. The power transistor of claim 5 characterized in that: said gate unit including a gate dielectric layer and a gate electrode layer on the gate dielectric layer.

7. The power transistor of claim 6 characterized in that: an isolation layer being on said gate electrode layer.

8. The power transistor of claim 5 characterized in that: in the first conductive drift region, there is a first conductive ion implantation region; the implantation region is between the two second conductive body regions.

9. A manufacture method of a power transistor structure of claim 1 characterized in that the method comprises:
   step 1: forming a lightly doped first conductive epitaxial layer on the semiconductor substrate, on which two gate units are made;
   step 2: making an isolation structure around said two gate units to cover a surface of said two gate units and isolate the two gate units;
   step 3: forming two heavily doped first conductive regions and two second conductive regions on the two sides of said isolation structure in the epitaxial layer, the rest of which being a drift region; wherein, on each side of said isolation structure, there being one heavily doped first conductive region and one second conductive region; each side of the heavily doped first conductive region extending below said isolation structure; each side of the second conductive region extending below the gate unit adjacent to it and separating the heavily doped first conductive region and the drift region;

step 4: etching off the first conductive region, which is not blocked by said isolation structure;

step 5: making electrodes, which are connected to the first and the second conductive regions which are on the sides of said isolation structure; and step 6: making electrode under said semiconductor substrate.

10. The manufacture method of a power transistor structure of claim 9 characterized in that: in step 1, the semiconductor substrate uses the first conductive substrate.

11. The manufacture method of a power transistor structure of claim 9 characterized in that: in step 1, the semiconductor substrate uses the second conductive substrate.

12. The manufacture method of a power transistor structure of claim 9 characterized in that: the gate unit includes a gate dielectric layer and a gate electrode layer on the top of the gate dielectric layer; and an isolation layer on the gate electrode layer.

13. The manufacture method of a power transistor structure of claim 9 characterized in that: in step 1, using the first conductive ion implantation method to enhance the ion concentration of the first conductive type on the top of the epitaxial layer.

14. The manufacture method of a power transistor structure of claim 9 characterized in that: in step 3, using ion implantation method forms two heavily doped first conductive regions and two second conductive regions on each side of the isolation structure in the epitaxial layer.

15. The manufacture method of a power transistor structure of claim 9 characterized in that: by thermal diffusion method, enlarging the heavily doped first and second conductive regions; each side of the heavily doped first conductive region extending below said isolation structure; each side of the second conductive region extending below the gate unit adjacent to it and separating the heavily doped first conductive region and the drift region.

* * * * *